US010217713B2

United States Patent
Chopin et al.

(10) Patent No.: US 10,217,713 B2
(45) Date of Patent: Feb. 26, 2019

(54) SEMICONDUCTOR DEVICE ATTACHED TO AN EXPOSED PAD

(71) Applicant: NXP USA, Inc., Austin, TX (US)

(72) Inventors: Sheila F. Chopin, Austin, TX (US); Thomas H. Koschmieder, Austin, TX (US); Varughese Mathew, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/387,938

(22) Filed: Dec. 22, 2016

(65) Prior Publication Data

US 2017/0098618 A1 Apr. 6, 2017

Related U.S. Application Data

(62) Division of application No. 14/480,039, filed on Sep. 18, 2014, now abandoned.

(51) Int. Cl.
*H01L 23/00* (2006.01)
*H01L 29/06* (2006.01)
*H01L 23/495* (2006.01)

(52) U.S. Cl.
CPC ...... *H01L 23/562* (2013.01); *H01L 23/49503* (2013.01); *H01L 23/49513* (2013.01); *H01L 23/49541* (2013.01); *H01L 23/49568* (2013.01); *H01L 23/49582* (2013.01); *H01L 29/0657* (2013.01); *H01L 2924/0002* (2013.01)

(58) Field of Classification Search
CPC ......... H01L 23/49513; H01L 23/49541; H01L 23/495; H01L 23/49503; H01L 23/4951; H01L 2224/803; H01L 2224/8038; H01L 2224/80009
See application file for complete search history.

(56) References Cited

U.S. PATENT DOCUMENTS

2005/0242417 A1* 11/2005 Youn ................ H01L 23/49503 257/676
2014/0291825 A1* 10/2014 Yoneyama .......... H01L 23/4952 257/676

* cited by examiner

*Primary Examiner* — David A Zarneke

(57) ABSTRACT

The present disclosure provides for embodiments of packaged semiconductor devices. In one embodiment, a packaged semiconductor device for a die includes an exposed structure. The die has an active surface and a backside surface opposite the active surface. A first surface of the exposed structure is joined to die attach material, and the die attach material is further joined to the backside surface of the die. The exposed structure includes a plurality of openings through the exposed structure within a perimeter of the die, and the die is exposed through the plurality of openings.

16 Claims, 4 Drawing Sheets

50
10
52 52 52 52 52 52 52 52
14 14 14 14 14 14 14 14
54 56 58 60 62 64 66
12

11
10
13
FIG. 1
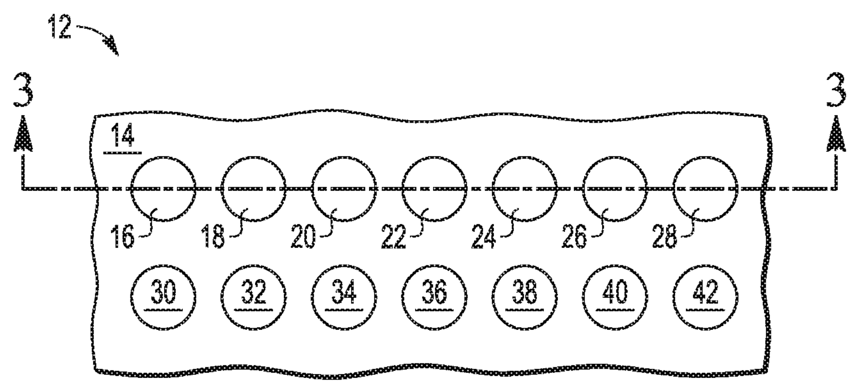
FIG. 2
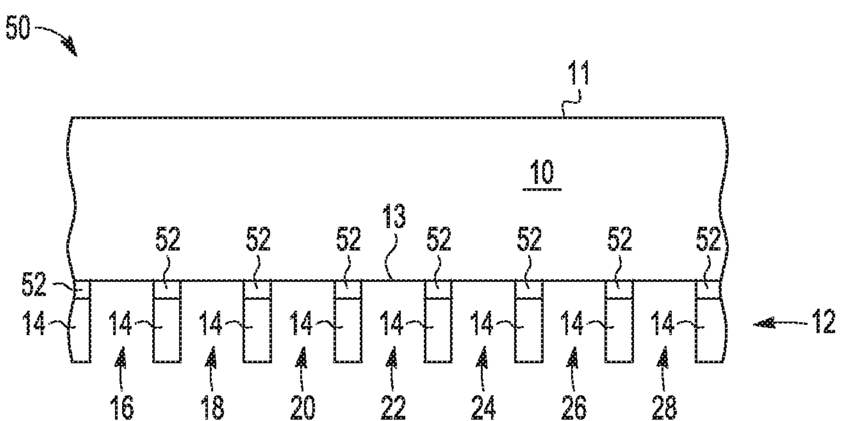
FIG. 3

SEMICONDUCTOR DEVICE ATTACHED TO AN EXPOSED PAD

CROSS-REFERENCE TO RELATED APPLICATIONS

This application is a divisional of U.S. patent application Ser. No. 14/480,039 having a filing date of Sep. 8, 2014, common inventors, common assignee, which is incorporated by reference in its entirety.

BACKGROUND

Field

This disclosure relates generally to semiconductor devices, and more specifically, to semiconductor devices attached to exposed pads.

Related Art

Some types of packaged semiconductor devices include a semiconductor die mounted on a lead frame. Lead frames, which include an exposed pad for attachment of the semiconductor die, are commonly manufactured by etching, stamping, and punching preformed sheets of metal such as copper, copper alloys, and iron-nickel alloys into desired shapes. A common problem in attaching the semiconductor die to the exposed pad is delamination. Another problem is that the material, commonly referenced as die attach, used to attach the semiconductor die to the exposed pad may crack and delaminate at the adjoining interfaces of the die attach. These problems have generally been approached by optimizing the materials, materials' thicknesses, and the conditions, such as temperature, under which the materials are attached. Although the problems have been reduced, they have not been completely solved, especially under all conditions.

Accordingly, there is a need for a further improvement in addressing one or more of the problems noted above regarding the attachment of a semiconductor die to an exposed pad.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIG. 1 is a cross section of a semiconductor die;

FIG. 2 is a top view of an exposed pad of a lead frame.

FIG. 3 is a cross section of the integrated circuit die of FIG. 1 as attached to the exposed pad of FIG. 2;

DETAILED DESCRIPTION

Figure 4:
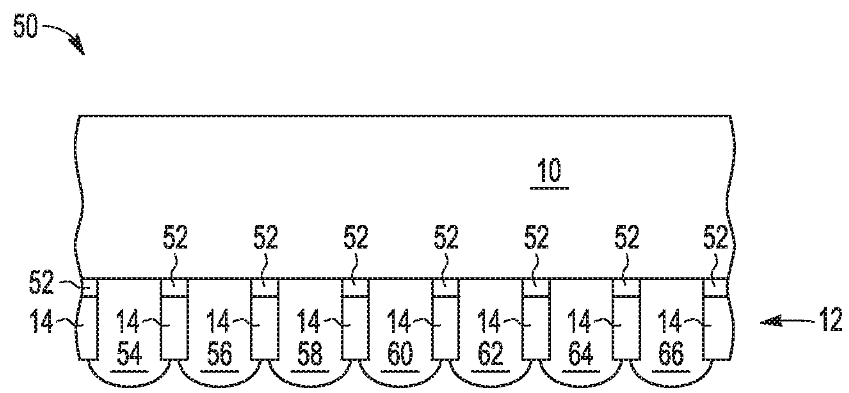
FIG. 4 is a cross section of the integrated circuit die of FIG. 1 as attached to the exposed pad at a subsequent stage in processing to that shown in FIG. 3.

In one aspect, an exposed pad of a lead frame has openings which expose portions of a backside of a semiconductor die. This allows for direct access to the portions of the semiconductor die in forming thermally conductive contacts to the semiconductor die. This is better understood by reference to the FIGs. and the following written description.

Shown in FIG. 1 is a semiconductor die 10 having a top surface 11 where active circuitry is present and a backside 13. The active circuitry provides functionality. Backside 13 is useful for contacting with heat dissipating elements.

Shown in FIG. 2 is an exposed pad 12, which is for contacting backside 13, of a lead frame. Exposed pad 12 is a metal sheet 14 having holes 16, 18, 20, 22, 24, 26 and 28 (16-28) in one row and holes 30, 32, 34, 36, 38, 40, and 42 (30-42) in another row. Holes 16-28 and 30-42 pass through metal sheet 14. These may be considered openings in which the die is exposed through the openings. The openings are within a perimeter of die 10. Exposed pad 12 may be copper. The openings can occupy substantial area. The area of the openings is related to the rigidity and strength of the material used for the exposed pad which is used to support semiconductor die 10.

Shown in FIG. 3 is a packaged die 50 having exposed pad 12 attached to backside 13 of semiconductor die 10 with a die attach layer 52. Exposed pad 12 is shown in FIG. 3 in cross section 3-3 of FIG. 2. Exposed pad 12 is formed prior to being attached to semiconductor die 10. Examples of ways exposed pad 12 may be formed include etching and stamping. Die attach layer 52 is applied to exposed pad 12 which is then pressed against semiconductor die 10 to result in packaged die 50 as shown in FIG. 3. Additional packaging, which is not shown, may occur such as plastic encapsulation. Such additional packaging does not extend to covering exposed pad 12. Backside surface 13 has a layer, such as aluminum, to which can be adhered a thermally conductive layer, such as solder. After attaching exposed pad 12, significant portions of the backside of die 10 are still exposed. Thus, even after attaching exposed pad 12, which supports die 10, access to the backside of die 10 is available.

Shown in FIG. 4 is packaged die 50 after applying a highly thermally conductive layer, such as solder, that at least partially fills openings 16-28 of FIGS. 2 and 3. As shown, the highly thermally conductive layer overfills openings 16-28 resulting in a thermally conductive fill 54 in opening 16, a thermally conductive fill 56 in opening 18, a thermally conductive fill 58 in opening 20. a thermally conductive fill 60 in opening 22, a thermally conductive fill 62 in opening 24, a thermally conductive fill 64 in opening 26, and a thermally conductive fill 66 in opening 28. Thermally conductive fills 54, 56, 58, 60, 62, 64, and 66 (54-66) may be solder and thus may be characterized as solder structures. Thermally conductive fills 54-66 are both joined to the sides of openings 16-28 and to semiconductor die 10 in openings 16-28.

Figure 5:
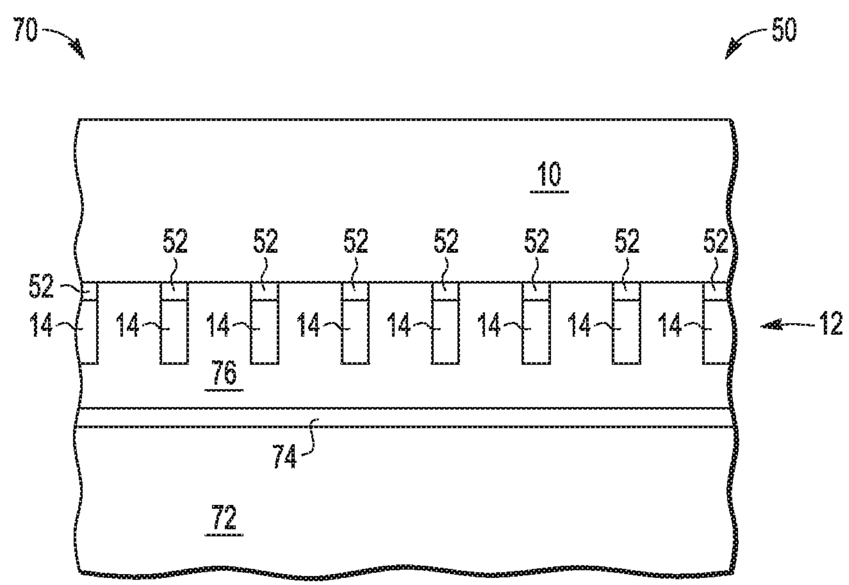
FIG. 5 is a cross section of the integrated circuit die of FIG. 1 as attached to the exposed pad after being attached to a solderable surface.

Shown in FIG. 5 is an assembly 70 having packaged die 50 coupled to a metal solderable surface 74 which is coupled to a support 72 that may be a circuit board or other feature such as a metal pin, a printed circuit board, a heat sink, an antenna, or even a motor vehicle. The attachment utilizes additional conductive material that is combined with thermally conductive fills (54-66) to result in a conductive fill layer 76 that fills the region between semiconductor die 10 and metal solderable surface 74. Some examples of a metal solderable surface include silver, gold, aluminum, tin, nickel-gold, and solder. Assembly 70 overcomes a discovered problem that a die attach that extends across the entire length of the backside of a semiconductor die can become detached and become a poor heat conductor. As shown for assembly 70, packaged die 50 is supported by exposed pad 12. The openings in exposed pad 12 provide for direct contact of the conductive fill material to the die 10. This ensures effective thermal conductivity from semiconductor die 10 to metal solderable surface 74. Conductive fill layer 76 functions as a heat spreader that may be sufficient. Support 72 may also function to dissipate heat. Any problems with die attach layer 52 are bypassed by the contact through openings 16-28 and further, because of openings 16-28 which operate to relieve stress, there is less likelihood of die attach layer 52 delaminating.

Figure 6:
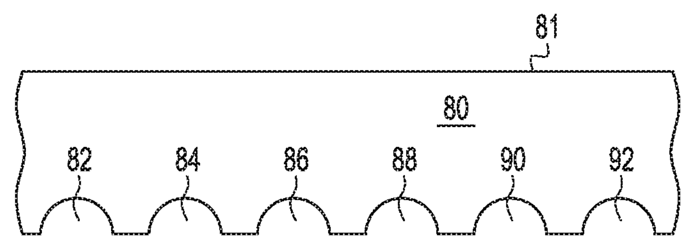
FIG. 6 is a cross section of a semiconductor die having a patterned back side.

Shown in FIG. 6 is semiconductor die 80 having a top surface 81 where the active circuitry is present and a plurality of dimples 82, 84, 86, 88, 90, and 92 (82-92) in an array on the backside have been formed. After forming dimples 82-92, which may be formed by a patterned etch, a metal deposition is performed resulting in a layer, which is solderable, being formed on the backside surface of die 80. This metallization step ensures that dimples 82-92 are solderable.

Figure 7:
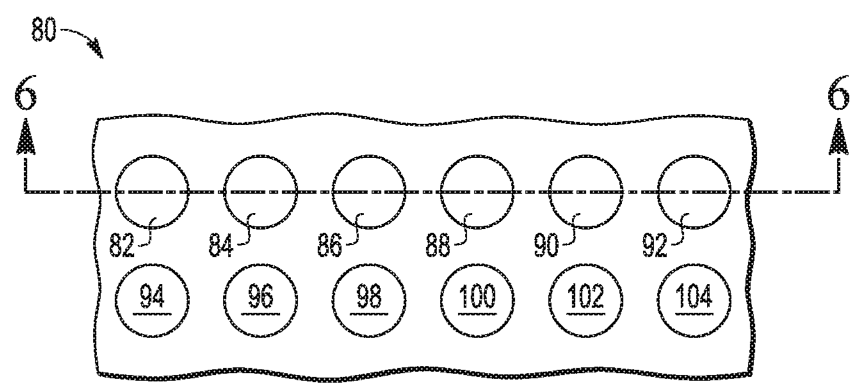
FIG. 7 is a bottom view of the patterned backside of the semiconductor die.

Shown in FIG. 7 is semiconductor die viewed toward the backside showing dimples 94, 96, 98, 100, 102, and 104 (94-104) in addition to dimples 82-92. The view shown in FIG. 6 is the cross section taken at 6-6 of FIG. 7. Dimples 82-92 and 94-104 may be formed by a patterned etch. This shows dimples 82-92 in one row and dimples 94-104 in a different row.

Figure 8:
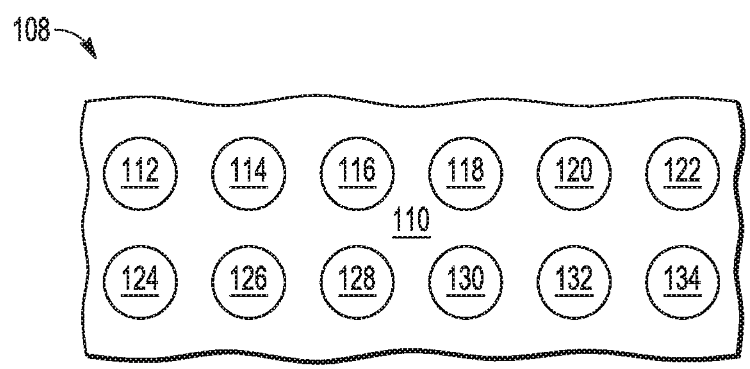
FIG. 8 is a bottom view of a patterned backside of a leadframe.

Shown in FIG. 8 is an exposed pad 108, which is for contacting the backside of semiconductor die 80, of a lead frame. Exposed pad 108 is a metal sheet 110 having openings 112, 114, 116, 118, 120, and 122 (112-122) in one row and openings 124, 126, 128, 130, 132, and 134 (124-134) in another row. Openings 112-122 and 124-134 pass through metal sheet 110. Metal sheet 110 may be copper. Exposed pad 108 may be the same as exposed pad 12 shown in FIG. 2. Openings 112-122 and 124-134 are made to align to dimples 82-92 and 94-104.

Figure 9:
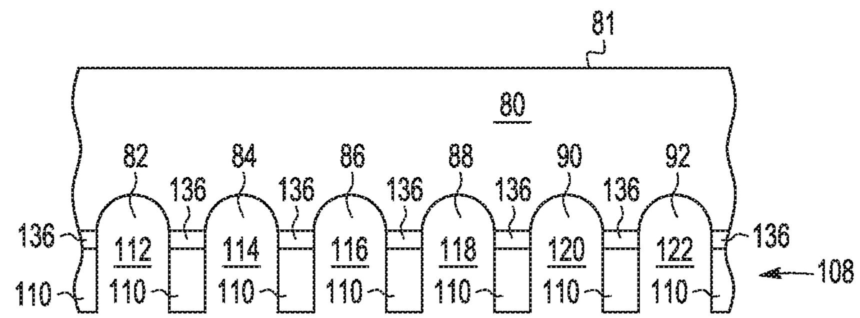
FIG. 9 is a cross section of the semiconductor die of FIGS. 6 and 7 as attached to the lead frame of FIG. 8.

Shown in FIG. 9 after attaching exposed pad 108 to the backside of semiconductor die 80 with centers of openings 112-122 substantially aligned to centers of dimples 82-92. Exposed pad 108 is attached to semiconductor die 80 with a die attach 136. Although not shown in FIG. 9, centers of openings 124-134 are similarly substantially aligned to centers dimples 94-104.

Figure 10:
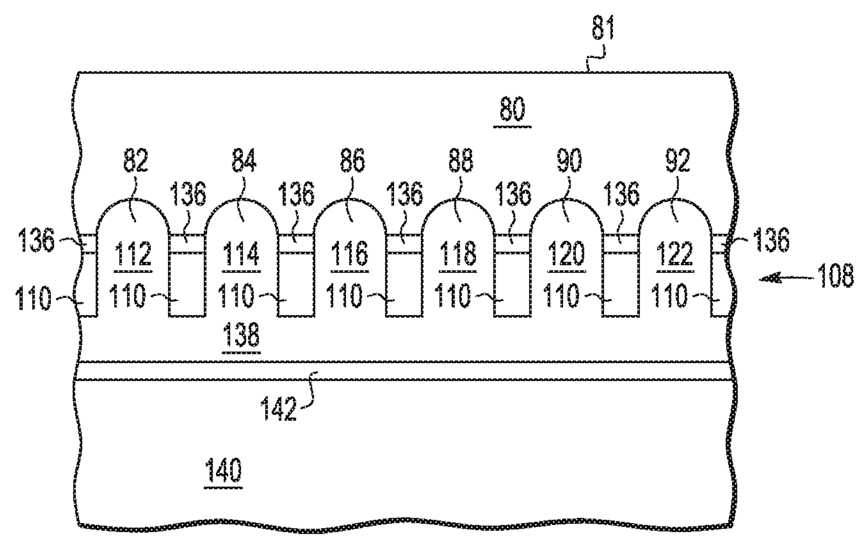
FIG. 10 is a cross section of the semiconductor die and leadframe of FIG. 9 attached to a solderable surface.

Shown in FIG. 10 after filling openings 112-122 and dimples 82-92 with a conductive material 138, which may be solder, and attaching conductive material 138 to a metal solderable surface 142. This is readily achieved with the alignment of openings 112-122 to dimples 82-92. Similar to assembly 70 of FIG. 5, solderable surface 142 is coupled to a support 140 that may be a circuit board or other feature such as an electronic device that may even be a motor vehicle. In addition to the benefits, as previously described relative to FIG. 5, of exposed pad 108, which also functions to support semiconductor die 80, dimples 82-92 operate to increase the surface area of contact between conductive material 138 and semiconductor die 80.

By now it is apparent that a semiconductor device has been described in which a packaged semiconductor device includes a die having an active surface and a backside surface opposite the active surface. The packaged semiconductor device further includes an exposed pad of a lead frame, wherein a first surface of the exposed pad is joined to die attach material, the die attach material is further joined to the backside surface of the die, the exposed pad comprises a plurality of openings through the exposed pad within a perimeter of the die, and the die is exposed through the plurality of openings. The packaged semiconductor device may have a further characterization by which the die attach material comprises a solder die attach material. The packaged semiconductor device may have a further characterization by which the die attach material is patterned with a second plurality of openings that are aligned to the plurality of openings. The packaged semiconductor device may have a further characterization by which a solderable surface of the die is exposed through the plurality of openings. The packaged semiconductor device may have a further characterization by which the die comprises a plurality of recesses on the backside surface of the die, and the plurality of recesses are aligned with the plurality of openings. The packaged semiconductor device may have a further characterization by which each of the plurality of recesses includes a solderable surface of the die, and solderable surfaces of the plurality of recesses are exposed through the plurality of openings. The packaged semiconductor device may further include a plurality of solder structures joined to the die through the plurality of openings. The packaged semiconductor device may have a further characterization by which the plurality of solder structures are further joined to sides of the plurality of openings. The packaged semiconductor device may have a further characterization by which at least one of the plurality of solder structures is further joined to at least a portion of a second surface of the exposed pad, and the second surface of the exposed pad is opposite the first surface of the exposed pad. The packaged semiconductor device may have a further characterization by which a second surface of the exposed pad is joined to a solderable surface of a package mounting structure, and the second surface of the exposed pad is opposite the first surface of the exposed pad. The packaged semiconductor device may further include a solder layer joined to the second surface of the exposed pad, wherein the solder layer is further joined to the solderable surface of the package mounting structure. The packaged semiconductor device may have a further characterization by which the package mounting structure comprises one of a metal pin, a printed circuit board, a heat sink, an antenna, and a structure having a solderable surface. The packaged semiconductor device may have a further characterization by which the die comprises one of a semiconductor die, a gauge, a sensor device, and a sensor die. The packaged semiconductor device may have a further characterization by which at least one of the plurality of recesses is located adjacent to a heat-producing area of the die. The packaged semiconductor device may have a further characterization by which each of the plurality of recesses has an opening into the backside surface of the die, and each opening has a cross-sectional area bounded by at least one of a polygonal shape, a curved shape, and an amorphous shape.

Also described is a packaged semiconductor device for a die having an exposed structure, wherein the die has an active surface and a backside surface opposite the active surface, a first surface of the exposed structure is joined to die attach material, the die attach material is further joined to the backside surface of the die, the exposed structure comprises a plurality of openings through the exposed structure within a perimeter of the die, and the die is exposed through the plurality of openings. The packaged semiconductor device may have a further characterization by which the exposed structure comprises one of a heat sink, an exposed pad of a lead frame, a metal pin, an antenna, and a structure having a solderable surface, and the die attach material comprises thermal interface material. The packaged semiconductor device may have a further characterization by which the thermal interface material comprises a solder material, and the thermal interface material is patterned with a second plurality of openings that are aligned to the plurality of openings. The packaged semiconductor device may have a further characterization by which the die comprises a plurality of recesses on the backside surface of the die, and the plurality of recesses are aligned with the plurality of openings. The packaged semiconductor device may have a further characterization by which one or more solderable surfaces of the die are exposed through the plurality of openings, and a plurality of solder structures are joined to the die through the plurality of openings.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. For example, the materials other than those described may be found to be effective. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A packaged semiconductor device comprising:

a die having an active surface and a backside surface opposite the active surface;

an exposed pad of a lead frame; and a die attach material layer between the backside surface of the die and the exposed pad, wherein a first surface of the exposed pad is joined to the die attach material layer, the die attach material layer is further joined to the backside surface of the die, the exposed pad comprises a plurality of openings through the exposed pad within a perimeter of the die, the backside surface of the die is exposed through the plurality of openings and through the die attach material layer, the die comprises a plurality of recesses on the backside surface of the die, the plurality of recesses are aligned with the plurality of openings, each of the plurality of recesses includes a solderable surface of the die, and solderable surfaces of the plurality of recesses are exposed through the plurality of openings and through the die attach material layer.

2. The packaged semiconductor device of claim 1, wherein the die attach material layer comprises a solder die attach material.

3. The packaged semiconductor device of claim 1, wherein the die attach material layer is patterned with a second plurality of openings that are aligned to the plurality of openings.

4. The packaged semiconductor device of claim 1, wherein a solderable surface of the die is exposed through the plurality of openings and through the die attach material layer.

5. The packaged semiconductor device of claim 1, further comprising:

a plurality of solder structures joined to the backside surface of the die through the plurality of openings and through the die attach material layer.

6. The packaged semiconductor device of claim 5, wherein the plurality of solder structures are further joined to sides of the plurality of openings.

7. The packaged semiconductor device of claim 5, wherein at least one of the plurality of solder structures is further joined to at least a portion of a second surface of the exposed pad, and the second surface of the exposed pad is opposite the first surface of the exposed pad.

8. The packaged semiconductor device of claim 1, wherein a second surface of the exposed pad is joined to a solderable surface of a package mounting structure, and the second surface of the exposed pad is opposite the first surface of the exposed pad.

9. The packaged semiconductor device of claim 8, further comprising:

a solder layer joined to the second surface of the exposed pad, wherein the solder layer is further joined to the solderable surface of the package mounting structure.

10. The packaged semiconductor device of claim 8, wherein the package mounting structure comprises one of a metal pin, a printed circuit board, a heat sink, an antenna, and a structure having a solderable surface.

11. The packaged semiconductor device of claim 1, wherein the die comprises one of a semiconductor die, a gauge, a sensor device, and a sensor die.

12. The packaged semiconductor device of claim 1, wherein at least one of the plurality of recesses is located adjacent to a heat-producing area of the die.

13. The packaged semiconductor device of claim 1, wherein each of the plurality of recesses has an opening into the backside surface of the die, and each opening has a cross-sectional area bounded by at least one of a polygonal shape, a curved shape, and an amorphous shape.

14. A packaged semiconductor device for a die comprising:

an exposed structure, wherein the die has an active surface and a backside surface opposite the active surface, a die attach material layer is between the backside surface of the die and the exposed structure, a first surface of the exposed structure is joined to the die attach material layer, the die attach material layer is further joined to the backside surface of the die, the exposed structure comprises a plurality of openings through the exposed structure within a perimeter of the die, the backside surface of the die is exposed through the plurality of openings and through the die attach material layer, the die comprises a plurality of recesses on the backside surface of the die, the plurality of recesses are aligned with the plurality of openings, one or more solderable surfaces of the die are exposed through the plurality of openings and through the die attach material layer, and a plurality of solder structures are joined to the one or more solderable surfaces of the die through the plurality of openings.

15. The packaged semiconductor device of claim 14, wherein the exposed structure comprises one of a heat sink, an exposed pad of a lead frame, a metal pin, an antenna, and a structure having a solderable surface, and the die attach material layer comprises thermal interface material.

16. The packaged semiconductor device of claim 15, wherein the thermal interface material comprises a solder material, and the thermal interface material is patterned with a second plurality of openings that are aligned to the plurality of openings.

* * * * *